United States Patent [19]

Franksen

[11] Patent Number: 4,635,015
[45] Date of Patent: Jan. 6, 1987

[54] SWITCHING DEVICE FOR SHORTING AT LEAST ONE SUPERCONDUCTING MAGNET WINDING

[75] Inventor: Holger Franksen, Erlangen, Fed. Rep. of Germany

[73] Assignee: Siemens Aktiengesellschaft, Berlin and Munich, Fed. Rep. of Germany

[21] Appl. No.: 694,775

[22] Filed: Jan. 25, 1985

[30] Foreign Application Priority Data

Jan. 27, 1984 [DE] Fed. Rep. of Germany ....... 3402828

[51] Int. Cl.$^4$ .............................................. H01F 7/22
[52] U.S. Cl. ................................ 335/216; 174/126 S; 336/DIG. 1
[58] Field of Search .............................. 335/216, 299; 336/DIG. 1; 174/126 S, 128 S

[56] References Cited

U.S. PATENT DOCUMENTS 3,559,128  1/1971  Kingston et al. .................... 335/216
4,016,526  4/1977  Gamet et al. .................... 335/216 X

FOREIGN PATENT DOCUMENTS 3112194  10/1982  Fed. Rep. of Germany ...... 335/216
3213093   8/1983  Fed. Rep. of Germany ...... 335/216

OTHER PUBLICATIONS

Computertomographic 1 (1981) 2-10, Georg Thieme Verlag Stuttgart—New York.

Primary Examiner—George Harris
Attorney, Agent, or Firm—Kenyon & Kenyon

[57] ABSTRACT

A switching device for shorting at least one superconducting magnet winding contains at least two contacts which can be cooled by a cryogenic medium and joined together by means of an actuator in such a manner that a superconducting current path and a normally conducting current path which completely stabilizes the superconducting current path are developed. The switching device exhibits a relatively large ohmic resistance in its open switch state. To this end, a current path with at least one partially stabilized superconductor with a resistance of at least 200 ohms in the normally conducting state of the superconductor and which is always closed is provided. A predetermined number of turns of the partially stabilized superconductor is connected to a switchable heating device in thermal contact therewith and electrically insulated therefrom. In addition, at least two contacts of normally conducting material are provided, each of which can be connected to the magnet winding via an electric conductor. The normally conducting contacts are joined to the partially stabilized superconductor in such a manner that the sections of the superconductor extending between these contacts are connected in parallel, at least partially, by the contacts when the switch is closed.

20 Claims, 2 Drawing Figures

SWITCHING DEVICE FOR SHORTING AT LEAST ONE SUPERCONDUCTING MAGNET WINDING

BACKGROUND OF THE INVENTION

This invention relates to superconducting windings in general and more particularly to a switching device for shorting at least one superconducting magnet winding.

A switching device for shorting at least one superconducting magnet with at least two contacts which can be cooled by a cryogenic medium and can be joined together by means of an actuator in such a way that a superconducting current path and a normally conducting path which completely stabilizes the superconducting current path are developed, is described in DE-OS No. 25 21 328. As soon as the magnetic field of a superconducting magnet winding, especially a high field intensity magnet coil, is once built up, no further electric energy need be supplied from the outside to maintain the field of the coil. Then, only the energy required for the refrigeration equipment needed for maintaining the superconductive state of the winding must still be supplied. For storing the electric energy fed into the magnet winding, the winding can therefore be short-circuited at its ends by means of a switching device, also called persistent switching device, with as low a resistance as possible. The current then flows almost unattenuated in the shorted circuit so formed, and the power supply required for exciting the magnet winding can thus be interrupted.

The switching device described in DE-OS No. 25 21 328 mentioned above contains two contacts, each of which comprises a support element of normally conducting material acting as a matrix in which mutually parallel superconducting parts are embedded. The contacts are kept indirectly by at the operating temperature of the superconducting conductor sections by a cryogenic coolant. A mechanical actuator required for opening and closing the switching device is designed so that the respective superconducting parts as well as their normally conducting parts can be joined together to thus form a superconducting current path and a normally conducting current path which completely stabilizes the superconducting current path. Complete stabilization is understood here to mean a sufficiently large conductor cross section of the normally conducting current path shunted across the superconducting current path so that the entire operating current can be carried, at least for a short time, without damage to the switching device, if the superconducting current path becomes normally conducting.

In this switching device, the surface of the one contact is made curved, while the other contact may have, for instance, a plane or concave surface. To assure a low contact resistance between the two contacts, a relatively high contact pressure is required, in addition to an exact guidance of the contacts. Even so, it cannot always be assured that all corresponding superconducting conductor sections of the two contacts are joined together with about the same contact pressure and thereby cause approximately the same contact resistances in the corresponding superconducting current path. It must rather be assumed that some superconducting conductor sections are joined together with only relatively small contact pressure and thus lead to correspondingly high contact resistances. With the known switching device, reproducible resistances in the order of $10^{-9}$ ohms or less cannot be assured definitely for extended periods of time. Such low resistances, however, are required especially for switching devices for shorting large superconducting magnets such as must be provided, for instance, for nuclear fusion equipment or for nuclear spin tomography (nuclear magnetic resonance tomography).

Besides such mechanical switching devices with the problem of long-term stability and reproducibility of the resistance in the closed state, superconducting switching devices also are known, the superconducting current path of which is put in normal conduction by a separate heating device for developing a quasi-open state of the switching device (see DE-OS No. 31 35 177). If highly stabilized superconductors are used for such switching devices, the problem of too low a resistance in the open switch position arises, so that only a correspondingly slow excitation of the superconducting magnet winding is possible. If, therefore, only partially stabilized superconductors are used, this means an accordingly low current carrying capacity in the closed state. While a higher resistance of the switching device in the open state and a generally sufficient current carrying capacity in the closed state are achieved, if a poorly conducting stabilizing material such as a copper-nickel alloy is used instead of copper, for fast excitation of, in particular, large magnets with high inductance, however, the resistance of the switching device in the open state is also not sufficient here. Still higher contact resistances between the copper-nickel stabilized switch material and the generally copper stabilized conductor of the magnet cause further difficulties to appear.

It is therefore an object of the present invention to improve a switching device of the type mentioned at the outset in such a direction that it will result in a short circuit of the superconducting magnet winding with a very low resistance of $10^{-9}$ ohms or less and a sufficiently high resistance of, for instance, 200 ohms in the open state in a relatively simple manner. Here, sufficient stabilization and sufficiently high current carrying capacity the switching device in the closed state are assured.

SUMMARY OF THE INVENTION

According to the present invention, this problem is solved by providing a current path which is always closed, with at least one partially stabilized superconductor having a resistance of at least 200 ohms in the normally conducting state of the superconductor; connecting a predetermined number of turns to the partially stabilized superconductor to a switchable heating device such that it is in thermal contact therewith and electrically insulated therefrom; providing at least two contacts of normally conducting, electrically highly conductive material, which can be connected to the magnet winding via an electric conductor; and joining the normally conducting contacts to the partially stabilized superconductor in such a manner that the sections of the superconductor extending between these contacts are at least partially connected in parallel by the contacts.

The required ohmsic minimum value of the partially stabilized superconductor of this switching device can be obtained without difficulty by the proper design of the conductor length and by limiting the cross section of stabilizing material. The number of turns of the partially stabilized superconductor determines the number of sections of the superconductor connected in parallel by means of the normally conducting contacts and is set by the common current carrying capacity of these sections obtainable with this parallel connection. The two normally conducting contacts have a predetermined conductor cross section and consist, for instance, of the same stabilizing material as is provided for the partially stabilized superconductor.

The advantages connected with the design of the switching device according to the present invention are, in particular, that a very low resistance can be achieved in the closed state of the switch and a relatively high resistance in the open state of the switch. At the same time, good current carrying capacity and stabilization by means of the normally conducting contacts in the closed state can be assured. In addition, it becomes possible to achieve good contact of the switch material with the conductor of the magnet winding.

DETAILED DESCRIPTION

Figure 1:
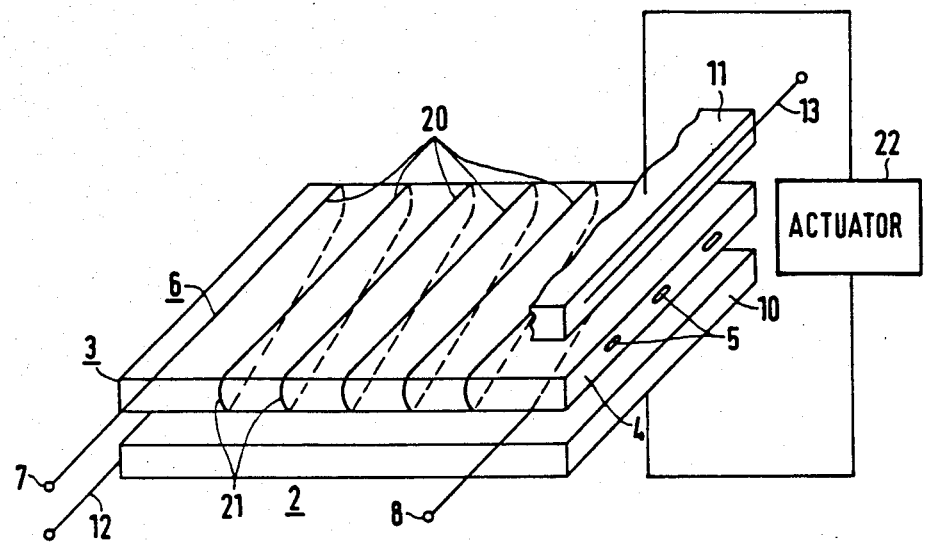
FIG. 1 is an oblique view of an embodiment of a switching device according to the present invention.

The switching device shown in FIG. 1 is shown in the open state of the switch. It comprises a plate-shaped heating device 3 which comprises a support plate 4 of nonconductive material, in which several heating lines 5 are arranged. Around the heating device 3 designed in this manner, a multiplicity of turns 20 of a wire-shaped superconductor 6 is wound. This superconductor is to be only partially stabilized, i.e., its superconductive material is connected only with a relatively small cross section of electrically highly conductive, normally conducting material which is capable of carrying only part of a predetermined operating current without damaging the entire superconductor. Advantageously, a degree of stabilization, i.e., the ratio of the share of normally conductive stabilizing material and the share of superconductive material is chosen at most as 1. The superconductor 6 can be connected in an electrically conducting manner at terminals 7 and 8 to the corresponding ends of a superconducting magnet winding, not shown in the Figure. The magnet winding may be, for instance, the winding of a magnet system for generating the magnetic base field of a system for nuclear spin tomography or the winding of a magnet of a nuclear fusion system. These windings are generally constructed of completely stabilized superconductors which can readily be connected to the superconductor 6 to form a short circuit.

The superconductor 6 arranged around the electrically nonconducting heatable support plate 4, therefore, represents a superconducting shorting or continuous (persistent) current switch which can be switched in a well-known manner by means of the heating device 3 between its superconducting state with extremely low resistance, particularly of $10^{-9}$ ohms and its normally conducting higher resistance state, where the higher resistance normally conducting state represents the open switch state. Since the superconductor 6 comprises only relatively little stabilizing material and is in addition wound in great length around the support plate 4, a high resistance of 200 ohms or more in the open state of the switch can be achieved thereby without difficulty.

In the closed state, this superconducting switch, designed in this manner, must be capable of carrying the entire operating current through the magnet winding shorted by it. Its current carrying capacity must be correspondingly high. If in addition, a disturbance of the magnet winding, i.e., an unintended transition occurs, superconductor 6 alone is not capable, due to its partial stabilization, of taking over the entire operating current without overheating and thereby, damage or even destruction. According to the present invention, in the closed state of the switch, the switching device 2 is shunted, in addition, to the partially stabilized normal conductor cross section of the superconductor 6, by further normal conducting material in that this additional material covers at least the major part of the superconductor 6 and thus leads to complete stabilization of the superconductor. For this purpose, the switching device 2 contains additionally at least two plate-shaped switching jaws or contacts 10 and 11 of a suitable stabilizing material, for instance, of copper with indium or silver cladding arranged in parallel planes. These two contacts 10 and 11, of which the upper contact 11 is shown in the Figure only in part, are movable relative to each other by means of an mechanical actuator 22 shown schematically in the Figure and can be joined, for closing the switching device 2, to the corresponding flat sides of the heating device 3 arranged between them, and wound with the superconductor 6. Thereby, the normally conducting material of the contacts 10 and 11 is mechanically pressed on the superconductor 6, and specifically advantageously in such a manner that the turns 20 of the conductor winding are connected in parallel. In this manner, good current carrying capacity and stabilization in the closed switch state are achieved without the need for the electric resistance between the normally conducting contacts 10 and 11 and the superconductor 6 to meet excessive requirements. It is furthermore assured that the partial sections 21 which extend between the contacts and are, therefore, not directly covered by the additional normal conducting material also can carry a sufficiently large current on the narrow sides of the support plate 4 due to the fact that the turns 20 are connected in parallel. The contacts 10 and 11 are connected at their respective end faces to superconducting leads 12 and 13. These leads, which may be completely stabilized superconductors or also normal conductors with an appropriately large conductor cross section, are connected to the ends of the connected magnet winding which can be shorted by the switching device 2. The leads 12 and 13 can, for instance, be directly at the ends of this winding. The parts of their superconductors 6 arranged outside the switching device 2 are, therefore, shunted by these leads and are sufficiently stabilized.

Figure 2:
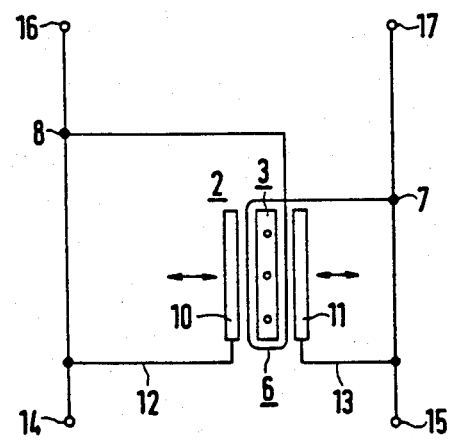
FIG. 2 is a circuit diagram of this embodiment of a switching device according to the present invention.

From the circuit sketch of the switching device 2 according to FIG. 1 shown in FIG. 2, the electrical connections of its individual components can be seen in greater detail. Parts identical with FIG. 1 are provided with the same reference numbers. The terminals 14 and 15 are for connection to an external power supply, not shown, while the superconducting magnet winding, not detailed here, is to be connected to terminals 16 and 17.

The superconductor 6 of the switching device 2 can be arranged directly in the cryogenic medium ensuring its superconductivity, which is, in particular, the coolant of the connected superconducting magnet winding, together with the contacts 10 and 11. Optionally, however, indirect cooling is also possible (see DE-OS No. 25 21 328).

The relatively small actuating force for joining the contacts 10 and 11 to the heating device 3 wound with the superconductor 6 not only allows operation by means of a mechanical linkage, but pneumatic or hydraulic actuation is also possible. Such actuation is well known in the art (see German Patent No. 23 24 371).

In the embodiment according to the Figures, it was assumed that the switching device according to the present invention comprises a plate-shaped heating element, around which a multiplicity of turns of a partially stabilized superconductor is wound. Optionally, however, it is also possible to apply the turns of the partially stabilized superconductor, for instance, in meander shape, on one side on a heating device, where, then, the two normally conducting contacts on that side must be attached in such a manner that, between them, the required parallel connection of individual conductor parts of these turns takes place.

Besides the rectangular shape of the flat sides of the support plate 4 or the heating device 3, other shapes such as round ones can also be provided. In addition, the two contacts 10 and 11 need not consist only of a single switch jaw. Optionally, each contact can comprise several mutually parallel switch jaws.

What is claimed is:

1. A switching device for shorting the ends of at least one superconducting magnet winding comprising:
    (a) a partially stabilized superconductor having a predetermined number of turns such that it forms a current path with a resistance at least 200 ohms in the normally conducting state adapted to have its ends connected to the ends of the winding;
    (b) a switchable heating device in thermal contact with and electrically insulated from said turns;
    (c) at least two contacts of normally conducting material, each of which is adapted to be connected to an end of the magnet winding via an electric conductor and to be cooled by a cryogenic medium; and
    (d) actuating means for joining the normally conducting contacts to the partially stabilized superconductor in such a manner that a plurality of sections of the superconductor extend between said contacts in parallel to thereby form a completely stabilized normally conducting path when said switch is closed.

2. A switching device according to claim 1, wherein the current path developed by the partially stabilized superconductor has a minimum resistance of 300 ohms.

3. A switching device according to claim 2, wherein the cross-sectional area of normally conducting stabilizing material on the partially stabilized superconductor is at most equal to the cross-sectional area of superconducting material.

4. A switching device according to claim 3, wherein the turns of the partially stabilized superconductor are wound around the heating device.

5. A switching device according to claim 3, wherein said heating device has two plane flat sides, to which the correspondingly shaped flat sides of the contacts are joined during switch closure.

6. A switching device according to claim 5, wherein said heating device comprises an electrically insulating support plate, through which at least one heater line extends.

7. A switching device according to claim 6, and further including, completely stabilized superconducting conductors coupling said normally conducting contacts to the ends of the magnet winding.

8. A switching device according to claim 1, wherein the turns of the partially stabilized superconductor are disposed on a flat side of the heating device and the contacts are joined at said flat side.

9. A switching device according to claim 1, wherein the cross-sectional area of normally conducting stabilizing material on the partially stabilized superconductor is at most equal to the cross-sectional area of superconducting material.

10. A switching device according to claim 1, wherein the turns of the partially stabilized superconductor are wound around the heating device.

11. A switching device according to claim 2, wherein the turns of the partially stabilized superconductor are wound around the heating device.

12. A switching device according to claim 1, wherein said heating device has two plane flat sides, to which the correspondingly shaped flat sides of the contacts are joined during switch closure.

13. A switching device according to claim 2, wherein said heating device has two plane flat sides, to which the correspondingly shaped flat sides of the contacts are joined during switch closure.

14. A switching device according to claim 4, wherein said heating device has two plane flat sides, to which the correspondingly shaped flat sides of the contacts are joined during switch closure.

15. A switching device according to claim 1, wherein said heating device comprises an electrically insulating support plate, through which at least one heater line extends.

16. A switching device according to claim 2, and further including completely stabilized superconducting conductors coupling said normally conducting contacts to the ends of the magnet winding.

17. A switching device according to claim 3, wherein said heating device comprises an electrically insulating support plate, through which at least one heater line extends.

18. A switching device according to claim 1, and further including completely stabilized superconducting conductors coupling said normally conducting contacts to the ends of the magnet winding.

19. A switching device according to claim 4, and further including completely stabilized superconducting conductors coupling said normally conducting contacts to the ends of the magnet winding.

20. A switching device according to claim 3, and further including completely stabilized superconducting conductors coupling said normally conducting contacts to the ends of the magnet winding.

* * * * *